United States Patent
Wang et al.

(10) Patent No.: US 8,486,769 B2
(45) Date of Patent: Jul. 16, 2013

(54) METHOD FOR FORMING METROLOGY STRUCTURES FROM FINS IN INTEGRATED CIRCUITRY

(75) Inventors: Chien-Hsun Wang, Hsinchu (TW);
Chih-Sheng Chang, Hsinchu (TW);
Ming-Feng Shieh, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 329 days.

(21) Appl. No.: 12/949,881

(22) Filed: Nov. 19, 2010

(65) Prior Publication Data
US 2012/0126375 A1   May 24, 2012

(51) Int. Cl.
*H01L 29/66* (2006.01)

(52) U.S. Cl.
USPC ............ 438/142; 438/157; 438/283; 438/478

(58) Field of Classification Search
USPC .................................. 438/478, 142
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2001/0003364 A1* | 6/2001 | Sugawara et al. | 257/192 |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0228372 A1 | 10/2007 | Yang et al. | |
| 2008/0258228 A1 | 10/2008 | Chuang et al. | |
| 2008/0263492 A1 | 10/2008 | Chuang et al. | |
| 2008/0290470 A1 | 11/2008 | King et al. | |

(Continued)

FOREIGN PATENT DOCUMENTS
JP 58178535 A * 10/1983

OTHER PUBLICATIONS

Bartlomiej Jan Pawlak, et al., U.S. Appl. 12/569,689, "Method of Fabricating Finfet Device," filed Sep. 29, 2009, 21 pages.

(Continued)

*Primary Examiner* — Ajay K Arora
(74) *Attorney, Agent, or Firm* — Haynes and Boone, LLP

(57) ABSTRACT

A method for forming a plurality of fins on a semiconductor substrate includes depositing a spacer layer to fill in gaps between the plurality of fins, the fins comprising a first material and the spacer layer comprising a second material. A first area is defined where the fins need to be broadened and a second area is defined where the fins do not need to be broadened. The method also includes patterning the spacer layer to remove spacers in the first area where the fins need to be broadened and applying an epitaxy process at a predetermined rate to grow a layer of the first material on fins in the first area. The spacer layer is removed in the second area where the fins do not need broadening.

20 Claims, 3 Drawing Sheets

U.S. PATENT DOCUMENTS

| | | | |
|---|---|---|---|
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |
| 2011/0084336 | A1* | 4/2011 | Luning et al. ............ 257/347 |

OTHER PUBLICATIONS

Hsien-Hsin Lin, et al., U.S. Appl. 12/703,918, "Method for Fabricating a Finfet Device," filed Feb. 11, 2010, 40 pages.

Chien-Chang Su, et al., U.S. Appl. 12/644,869, "Method for Incorporating Impurity Element in EPI Silicon Process," filed Dec. 22, 2009, 21 pages.

Tsung-Lin Lee, et al., U.S. Appl. 12/622,038, "Sacrificial Offset Protection Film for a Finfet Device," filed Nov. 19, 2009, 56 pages.

Jeff J. Xu, et al., U.S. Appl. 12/784,207, "Method of Forming EPI Film in Substrate Trench," filed May 20, 2010, 33 pages.

Tian-Choy, et al., U.S. Appl. 12/756,552, "Hybrid Gate Process for Fabricating Finfet Device," filed Apr. 8, 2010, 38 pages.

Ming-Lung Cheng, et al. U.S. Appl. 12/780,124, "Method and Apparatus for Enhancing Channel Strain," filed May 14, 2010, 35 pages.

Jhon Jhy Liaw, U.S. Appl. 12/823,907, "Cell Structure for Dual-Port SRAM," filed Jun. 25, 2010, 46 pages.

Jhon Jhy Liaw, U.S. Appl. 12/827,406, "Rom Cell Circuit for Finfet Devices," filed Jun. 30, 2010, 32 pages.

Jhon Jhy Liaw, U.S. Appl. 12/823,860, "Structure and Method for SRAM Cell Circuit," filed Jun. 25, 2010, 37 pages.

Jhon Jhy Liaw, et al., U.S. Appl. 12/827,690, "Layout for Multiple-Fin SRAM Cell," filed Jun. 30, 2010, 35 pages.

Jeng-Jung Shen, et al., U.S. Appl. 12/780,060, "Automatic Layout Conversion for Finfet Device," filed May 14, 2010, 29 pages.

Jeng-Jung Shen, et al., U.S. Appl. 12/780,426, "Finfet Boundary Optimization," filed May 14, 2010, 28 pages.

Yu-Lien Huang, et al., U.S. Appl. 12/840,830, "High Surface Dopant Concentration Semiconductor Device and Method of Fabricating," filed Jul. 21, 2010, 21 pages.

Peng-Soon Lim, et al., U.S. Appl. 12/827,512, "Gate Structures and Method of Fabricating Same," filed Jun. 30, 2010, 41 pages.

Tsu-Hsiu Perng, et al., U.S. Appl. 12/837,093, "Fin-Like Field Effect Transistor (Finfet) Device and Method of Manufacturing Same," filed Jul. 15, 2010, 30 pages.

Clement Hsingjen Wann, et al., U.S. Appl. 12/834,617, "In-Situ Spectrometry," filed Jul. 12, 2010, 20 pages.

Chia-Chung Chen, et al., U.S. Appl. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. 12/906,820, "Fin-Like Field Effect Transistor (Finfet) Device and Method of Manufacturing Same," filed Oct. 18, 2010, 55 pages.

Jeff J. Csu, et al, U.S. Appl. 12/917,902, "Fin-Like Field Effect Transistor (Finfet) Device and Method of Manufacturing Same," filed Nov. 2, 2010, 61 pages.

Mark van Dal, U.S. Appl. 12/900,895, "Method of Fabricating a Semiconductor Device Having an Epitaxly Region," filed Oct. 8, 2010, 21 pages.

Hsin-Chih Chen, et al, U.S. Appl. 12/907,272, "Multi-Fin Device by Self-Aligned Castle Fin Formation," filed Oct. 19, 2010, 34 pages.

Chien-Hsun Wang, et al, U.S. Appl. 12/952,376, "Method for Adjusting Fin Width in Integrated Circuitry," filed Nov. 23, 2010, 27 pages.

Chien-Hsun Wang, et al, U.S. Appl. 12/953,148, "Device and Method for Forming Fins in Integrated Circuitry," filed Nov. 23, 2010, 39 pages.

* cited by examiner

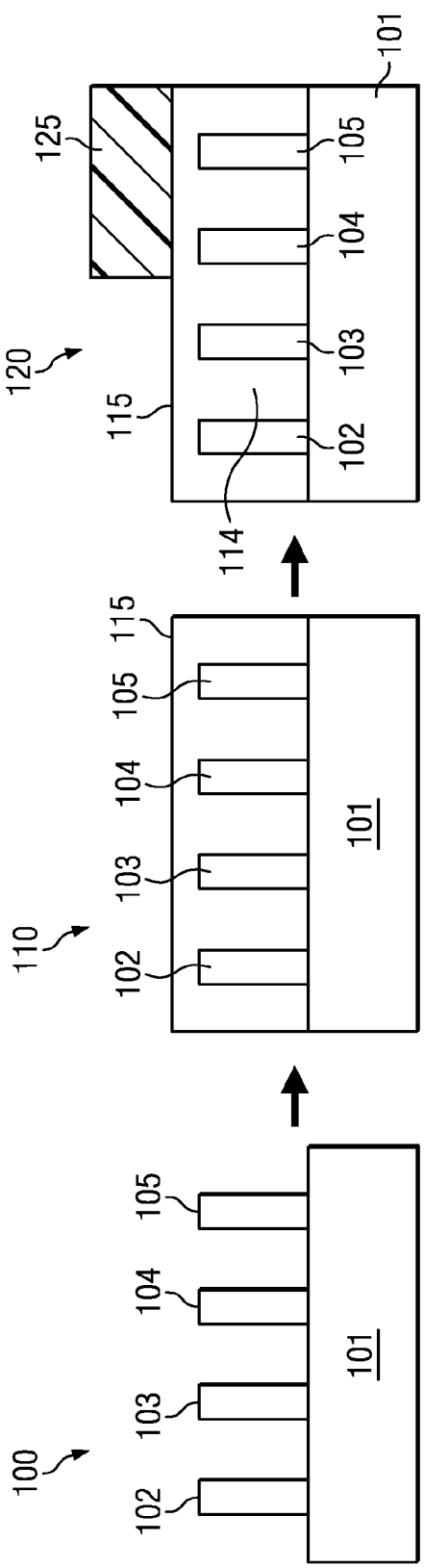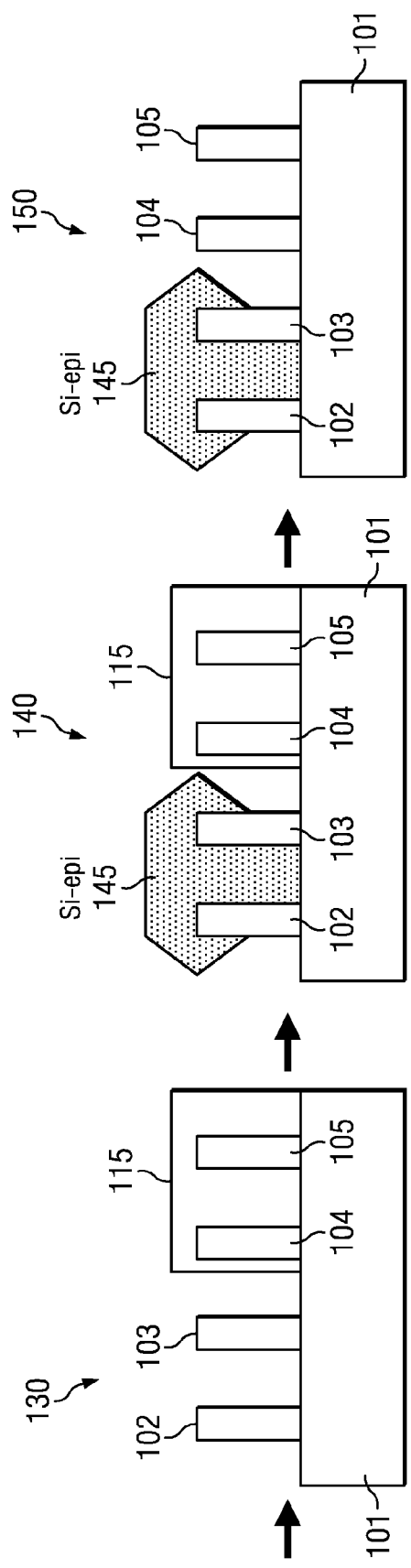

METHOD FOR FORMING METROLOGY STRUCTURES FROM FINS IN INTEGRATED CIRCUITRY

The present disclosure is related to the following commonly-assigned U.S. patent applications the entire disclosures of which are incorporated herein by reference: U.S. patent application Ser. No. 12/952,376 filed Nov. 23, 2010, entitled "Method for Adjusting Fin Width in Integrated Circuitry"; and U.S. patent application Ser. No. 12/953,148 filed Nov. 23, 2010, entitled "Device and Method for Forming Fins in Integrated Circuitry."

BACKGROUND

The present disclosure relates generally to semiconductor manufacturing, and more particularly, to integrated circuit devices and methods for forming such devices.

The semiconductor industry continues to have goals of higher density, superior performance, and lower cost. Scaling of device size has been a major tool user to reach these goals. However, scaling beyond the 100 nm process technology node has several difficulties associated with it, such as gate-oxide thickness, source and drain doping depths, and current density. These difficulties have resulted in new device structures to improve the existing metal oxide semiconductor field effect transistor (MOSFET) devices. Some of these new device structures include multi-gate MOSFET devices. A fin field effect transistor (FinFET) is a kind of multi-gate device which has a channel formed as a vertical fin. Multiple gates are formed over and along the sides of the vertical fin. A FinFET allows for a range of channel lengths and provides a broader process window for gate structures. A FinFET often includes high aspect-ratio semiconductor fins in which the channel and source/drain regions for the transistor are formed. The increased surface area of the channel and source/drain regions in a FinFET results in faster, more reliable and better-controlled semiconductor transistor devices. These advantages have found many new applications in various types of semiconductor devices.

A process for making a FinFET uses stringent process control, including in the area of contact landing. For example, contact holes need to overlay with thin vertical fin channels or raised source/drain well-pick-up lines. Process control for contact landing gets even more difficult when horizontal and vertical gate lines co-exist in multi-gate FinFET structures. In the metrology area, alignment marks and thickness monitor marks, among other metrology structures, may not be recognizable by metrology tools if these marks have the dimension of nanometers as a typical fin structure's lateral size. Therefore, it is preferable to create metrology marks by broadening the lateral fin dimensions on the existing fin layer without creating a new design layout, which is a highly resource intensive process few designers would invest in for a product.

As such, there is need for improved methods for forming alignment marks in a FinFET integrated circuitry in a flexible and cost effective way.

SUMMARY

The present disclosure provides a method for forming fins in semiconductor FinFET device, along with a corresponding semiconductor FinFET device. In one embodiment, a method for forming a plurality of fins on a semiconductor substrate includes depositing a spacer layer to fill in gaps between the plurality of fins, the fins comprising a first material and the spacer layer comprising a second material. A first area is defined where the fins need to be broadened and a second area is defined where the fins do not need to be broadened. The method also includes patterning the spacer layer to remove spacers in the first area where the fins need to be broadened and applying an epitaxy process at a predetermined rate to grow a layer of the first material on fins in the first area. The spacer layer is removed in the second area where the fins do not need broadening.

In another embodiment, a method for forming an integrated circuit device includes providing a substrate and forming a plurality of fins on the substrate. Spacers are formed in gaps between the plurality of fins. A first area is defined where the fins need to be broadened and a second area is defined where the fins do not need to be broadened. The second area is masked off and the spacers are removed from the first area. The method further includes growing a layer of material on the fins in the first area with the spacers removed, and thereafter, removing the spacers in the second area.

The present disclosure also describes an integrated circuit device including a substrate and a plurality of fins on the substrate. Fins in a first area of the device are relatively broad, while fins in a second area of the device are relatively narrow. A portion, but not all, of each relatively broad fin is formed by an epitaxial process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A-1F illustrate a number of fabrication steps in a selective fin-broadening process, when the epitaxial growth technique is applied, in accordance with some embodiments of the present disclosure.

DETAILED DESCRIPTION

Figure 2A:
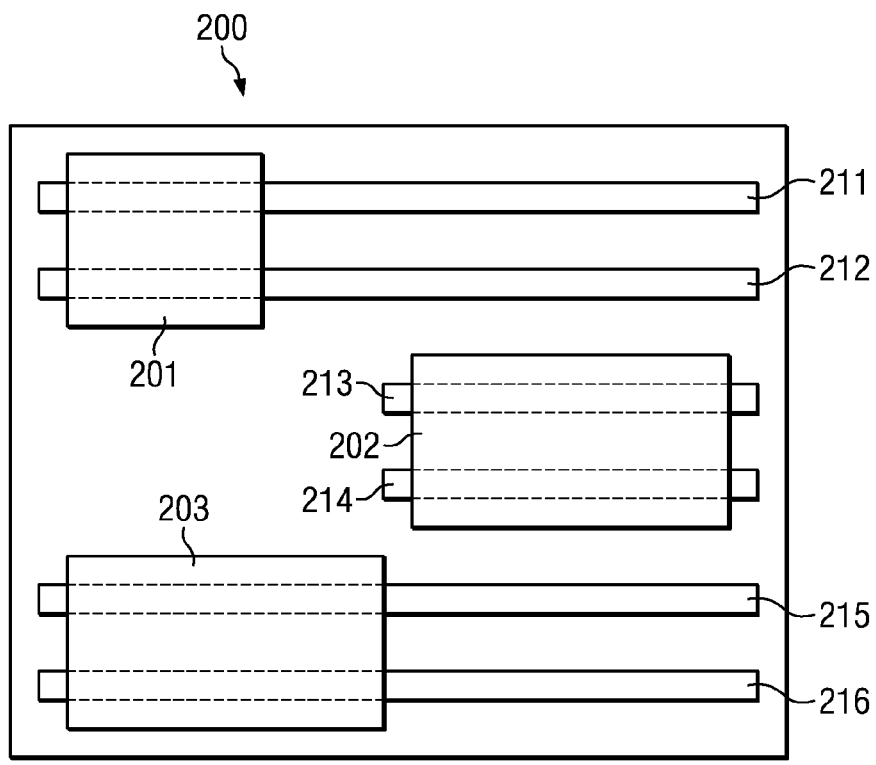
FIG. 2A-2B show top views of the selectively broadened fin structures.

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative and do not limit the scope of the invention.

Fin field effect transistors (FinFETs) use a substantially rectangular fin structure which can be formed in several ways. In a first method, bulk silicon on a substrate is etched into rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or deposited silicon such as silicon-on-insulator (SOI) with a barrier oxide (BOX) layer between the SOI and the underlying silicon substrate.

Both methods above use a photomask process at the desired fin dimension, often at or beyond the limit of the current photolithography technology. With the increasing demand to reduce device size, a variation of the first method was developed, in which elongated mandrels are used as a hardmask for etching into the bulk silicon, leaving thin spacers at both lateral sides of mandrel as fins after the mandrels are removed.

FIG. 1A-1F illustrate fabrication process steps of a selective fin-broadening process, when the epitaxial growth technique is applied, in accordance with some embodiments of the present disclosure. FIG. 1A-1F include six cross sectional views illustrating six steps in the fin broadening process. As described above, cross section 100 in FIG. 1A shows an initial fin layer on a substrate 101. At this step, mandrel material between the spacers has been removed by an etching operation, leaving just the spacers behind as fin structures 102, 103, 104, and 105. Fins can be fabricated out of crystalline silicon, amorphous silicon, germanium, germanium silicon, or other silicon compounds. Substrate 100 may be formed of silicon, silicon on insulator, amorphous silicon, or other silicon compounds. It is not necessary that fins be made of the same material as the substrate.

It may further be a desire to form fin structures of different widths. For example, a number of circuit components may use various lateral dimensions for various vertical structures, which may benefit from multi-sized fin structures. Furthermore, it may be desired for the fin structures formed in the above mandrel and spacer process to provide relatively large contact landing areas on the top surface of a connection line. In addition, it may be desired to improve well-pick-up in source and drain structures, as well as improved emitter efficiency in bipolar junction transistor (BJT) integrated circuits.

Another challenge is that nanometers-thin vertical structures formed in the above mandrel and spacer process are not large enough to be measurable by commercially available semiconductor processing equipment. For example, fin structures having a width on the order of tens of nanometers may not generate functional alignment signals in an optical alignment tool. Other metrology tools in overlay or thickness measurement prefer grating marks of micron size. Therefore, fin structures such as 102, 103, 104, and 105 need to be widened for applications requiring larger lateral dimensions.

As discussed, a method for adjusting the width of fin structures selectively in a fin layer is sought. As discussed above, alignment and metrology may be enabled by selectively adjusting fin widths on a Fin layer. A modification of the above-described method is discussed below to achieve one or more of the above-listed desires. It is further desired for the modification to maintain the fin density within the confines of existing transistor structures. Furthermore, it may be undesirable to require new photomasks to be made, especially for an existing product. Hence, it is desired to avoid creating new photomasks, and form FinFETs within the confines of the existing transistor structures so that layouts of other layers are not affected. If an additional photomask is required in the fin broadening process, the photomask should be a non-critical layer mask involving only large features, so the additional process has low cost.

Returning to FIG. 1B, cross section 110 includes a layer of spacer 115 which is deposited on fins 102, 103, 104, and 105, and filled between the fin gaps. The spacer layer 115 may fill below, at, or above the level of the top surface of the fins.

Cross sectional view 120 in FIG. 1C shows the FinFET after a lithography patterning process. Photo resist 125 is span on top of fins and spacers. Patterning leaves an opening in an area where fins 102 and 103 are located. Fins 102 and 103 need broadening. Although photo resist is open over fins 102 and 103 which need broadening, it does not limit situations when photo resist opens over fins 104 and 105 which do not need broadening. Whether photo resist covers the area where fins are to be broadened or not depends on whether a negative or a positive photo resist is applied.

In the next cross sectional view 130 in FIG. 1D, spacer material 114 in the resist opening is removed in an etching process, leaving clean surfaces for fins 102 and 103 that need to be broadened. Then, photo resist 125 is stripped. The etching process can be wet etch or dry etch.

In FIG. 1E, cross sectional view 140 shows broadened fins 102 and 103 post an epitaxial process. A grown epitaxial material, such as a Si-epi layer, covers fins 102 and 103 to form a much wider structure 145. Fins 104 and 105 on the right side of the substrate are protected from the epitaxial growth by the filler spacer 115. In FIG. 1F, cross sectional view 150 shows the final fin structures after spacer 115 is removed. Fins 104 and 105 remain at the same width as before the epitaxial process, while fins 102 and 103 have grown into a single structure 145. The epitaxial technique can generate other desired fin widths if necessary. For example, fins do not have to combine into one large structure such as 145. The epitaxial process can be controlled to grow materials at a predetermined rate, resulting in different final structures and different gaps between neighboring structures.

Figure 2B:
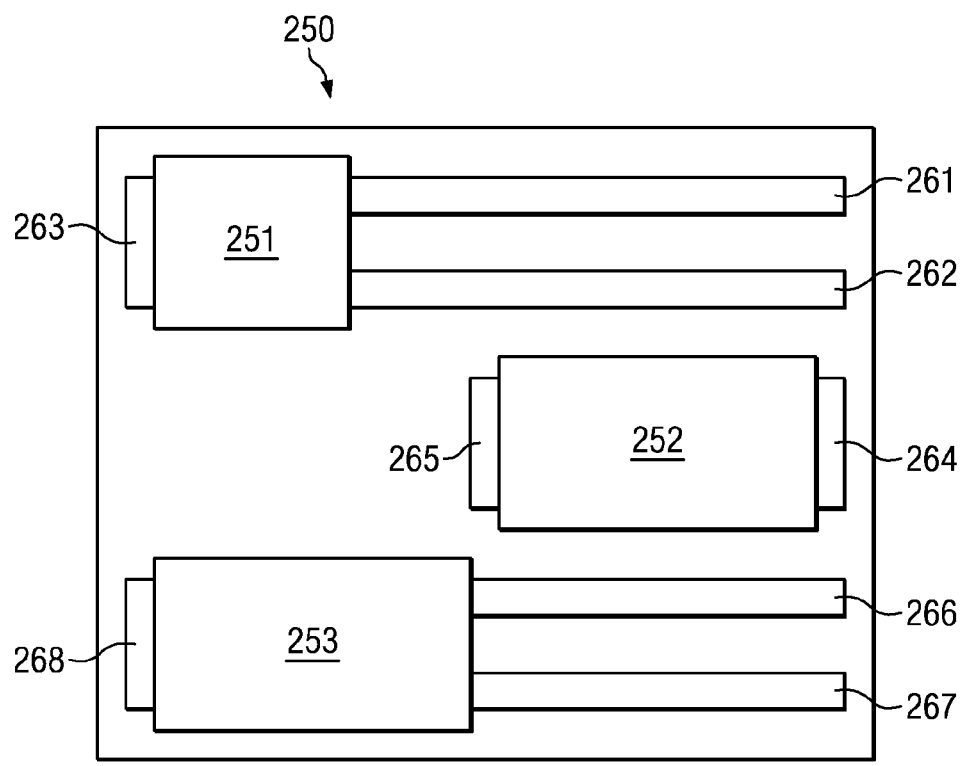

FIG. 2A-2B illustrate the top views of some exemplary selectively broadened fin structures, according to other embodiments of the present disclosure.

In FIG. 2A, top view 200 shows a fin layer after a photo resist is stripped in a lithographic process. A spacer layer is patterned corresponding to the process flow at 130 in FIG. 1D. In top view 200, protective spacers remain in areas marked as 201, 202, and 203. Portions of fins 211, 212, 213, 214, 215, and 216 outside spacer protected areas 201, 202, and 203 are now exposed to a selective epitaxial growth process.

In FIG. 2B, top view 250 shows the corresponding fin layer in top view 200 after the selective epitaxial growth is completed at step 140 in FIG. 1E. Spacers 251, 252, and 253 protected the fins under them from epitaxial deposition. Fins outside spacers 251, 252, and 253 were subject to epitaxial growth at predetermined different growth rates, resulting in different fin structure sizes. The growth rate depends on the final modified fin width required by the application. For example, fins 211 and 212 had the same width before epitaxial growth as shown in top view 200. After epitaxial growth, portions of fins 211 and 212 at the left side of spacer 251 have merged into one structure 263, and portions of fins 211 and 212 at the right side of spacer 251 have each become wider structures 261 and 262. Although all of 261, 262, and 263 have grown wider than the original fins 211 and 212, 263 is much wider than 261 and 262. Structures 213 and 214 are merged into single structures 264 and 265 at both sides of spacer 252 respectively. Similarly, after epitaxial growth, portions of fins 215 and 216 at the left side of spacer 253 have merged into one structure 268, and portions of fins 215 and 216 at the right side of spacer 253 have each become wider structures 266 and 267.

Figure 3:
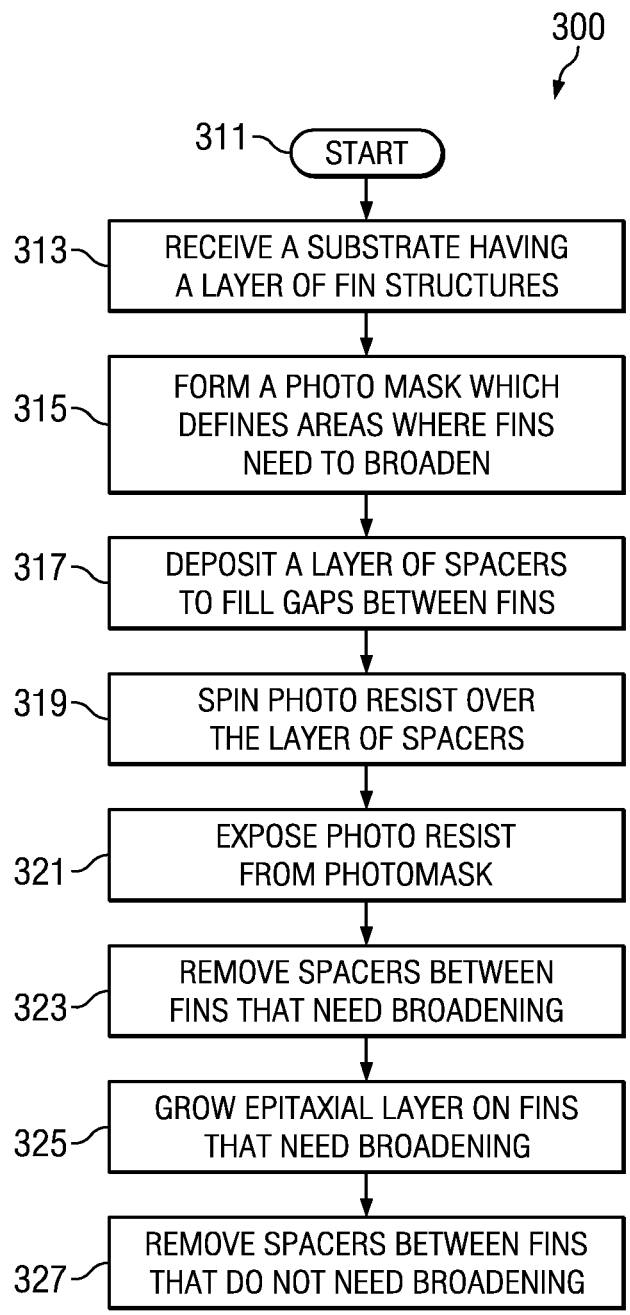
FIG. 3 shows a manufacturing method flowchart of the selective fin-broadening process, when the epitaxial growth technique is applied, in accordance with some embodiments of the present disclosure.

Now referring to FIG. 3, illustrated is a flowchart of a manufacturing method to selectively broaden fins, when the epitaxial growth technique described in FIG. 1 is applied, in accordance with some embodiments of the present disclosure. The method 300 may be used to fabricate the set forth structures 261, 262, 263, 264, 265, 266, 267, and 268. It is understood that additional steps may be provided before, during, and after the method 300, and some of the steps described below can be replaced or eliminated, for additional embodiments of the method.

Flow chart 300 begins at 311, and the first step 313 includes receiving a semiconductor substrate 101 containing fin structures on the top surface. These fin structures are fabricated using one of the techniques such as the mandrel-spacer forming described above. The substrate may be a semiconductor wafer such as a silicon wafer. Alternatively, the substrate may include other elementary semiconductor materials such as silicon on insulator (SOI), germanium, a compound semiconductor, and/or other substrate compositions known in the art. In step 315, a photo mask is provided, and the photo mask includes predetermined areas where fins need to be broadened for applications such as alignment marks. A layer of spacers is deposited over the fins and fills the gaps between fins in step 317. For selective etching purposes in later steps, the spacer material should not be the same as the material forming the fin structures. The spacer material can be silicon oxide, silicon nitride, and/or other compositions known in the art. A photo resist layer 125 is spinned over the fin and the layer of spacers in step 319. In step 321, a lithographic process patterns and forms desired openings over fins that need broadening. The lithography process for making these openings does not require a critical layer mask, because the alignment marks have large features. Therefore, adding the photomask process is likely inexpensive. Then photo resist 125 is stripped off, followed by etch step 323, which removes the spacers between those fins that need broadening. After step 323, the fins that need broadening are clean and ready for growing an epitaxial layer on their surfaces, the fins that do not need broadening are protected by the spacer material 115.

An epitaxy process is applied in step 325 to deposit a layer of crystalline film over the fins 102 and 103. In one embodiment, an epitaxial film is directly deposited on the surface of fins 102 and 103 that need broadening. In another embodiment, the deposited film first grows on the surface of the substrate next to fins 102 and 103 and gradually fills up the gaps between fins such as 102 and 103. In a different embodiment, epitaxial films on the fins only fill the gaps partially, leaving smaller gaps in between neighboring fins. Only the first embodiment discussed above is specifically shown in FIG. 1.

The epitaxy process may apply a homoepitaxy or a heteroepitaxy. In a homoepitaxy process, the epitaxial layer is composed of the same material as the fins, often when fins are fabricated of monocrystalline materials. In a heteroepitaxy process, the epitaxial layer contains one or more different materials from the fins, often applied to situations when compound semiconductors are involved.

Epitaxial deposition may use vapor-phase epitaxy (VPE), molecular-beam epitaxy (MBE), liquid-phase or solid-phase epitaxy (LPE or SPE). Although an epitaxial process can create high quality monocrystalline films, an epi-process in the current application should be designed to meet appropriate requirements in the process. For example, alignment marks in some applications may not require monocrystalline growth of the highest quality. In another application, depositing a polycrystalline or amorphous layer may be sufficient. The epitaxial layer 145 may merge fins 102 and 103 into one much wider structure. There are also other embodiments when the epitaxial layer only enlarges the fins but does not seal the gaps between the nearby fins. Another possible embodiment includes depositing the epitaxial film on the substrate top surface at the bottom of the fins and having the epitaxial layer partially or completely fills the gaps between the fins.

Method 300 then proceeds to step 327, in which a selective etch process removes the spacer material next to fins 104 and 105 which do not need broadening. This selective etch process should leave the epitaxial layer 145 intact. Step 327 completes the selective fin-broadening process.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a plurality of fins on a semiconductor substrate, the method comprising:

depositing a spacer layer to fill in gaps between the plurality of fins, the fins comprising a first material and the spacer layer comprising a second material;

defining a first area where the fins need to be broadened and a second area where the fins do not need to be broadened;

patterning the spacer layer to remove spacers in the first area where the fins need to be broadened;

applying an epitaxy process to grow a layer of the first material on fins in the first area where fins need to be broadened; and removing the spacer layer in the second area.

2. The method of claim 1, wherein the first material is selected from a group consisting of crystalline silicon, amorphous silicon, germanium, and semiconductor compounds.

3. The method of claim 1, wherein the first area is for metrology marks.

4. The method of claim 1, wherein the broadened fins are formed in a first direction.

5. The method of claim 1, wherein the broadened fins are formed in multiple directions.

6. The method of claim 1, wherein a resultant width of the broadened fins are determined by a predetermined rate of the epitaxy process.

7. The method of claim 1, wherein the epitaxial layer grown on a surface of fins in the first area fills a gap between a pair of adjacent broadened fins.

8. The method of claim 1, wherein the epitaxial layer grown on a surface of fins leaves a gap between a pair of adjacent broadened fins.

9. The method of claim 1, wherein the second material is selected from a group consisting of silicon oxide, silicon nitride, silicon oxynitride, semiconductor compounds, and metal compounds.

10. The method of claim 1, wherein the epitaxial process is a molecular beam epitaxy, a vapor-phase epitaxy, a liquid phase epitaxy, or a solid phase epitaxy.

11. The method of claim 1, wherein the epitaxial process is a homoepitaxy or a heteroepitaxy.

12. A method for forming an integrated circuit device, the method comprising:
   providing a substrate;
   forming a plurality of fins on the substrate;
   forming spacers in gaps between the plurality of fins;
   defining a first area where the fins need to be broadened and a second area where the fins do not need to be broadened;
   masking off the second area;
   removing the spacers in the first area;
   growing a layer of material on the fins in the first area with the spacers removed; and
   after growing the layer of material, removing the spacers in the second area.

13. The method of claim 12, wherein the fins and the layer of material comprise a material selected from the group consisting of crystalline silicon, amorphous silicon, germanium, and semiconductor compounds.

14. The method of claim 12, wherein the first area is for metrology marks.

15. The method of claim 12, wherein the layer of material grown on the fins in the first area fills a gap between a pair of adjacent broadened fins.

16. The method of claim 12, wherein the layer of material grown on the fins in the first area leaves a gap between a pair of adjacent broadened fins.

17. The method of claim 12, wherein the spacer layer includes silicon and oxygen.

18. The method of claim 12, wherein growing a layer utilizes a molecular beam epitaxy process.

19. The method of claim 12, wherein growing a layer utilizes a homoepitaxy process.

20. A method of fabricating an integrated circuit device, the method comprising:
   receiving a substrate having a plurality of fins disposed thereupon;
   forming a spacer material over the plurality of fins and within a gap defined between two fins of the plurality of fins;
   patterning the spacer material to remove the spacer material from a first fin-containing region;
   performing an epitaxy process on a fin of the plurality of fins disposed within the first fin-containing region after the patterning of the spacer material; and
   removing the spacer material from a second fin-containing region after the performing of the epitaxy process,
   wherein the performing of the epitaxy process forms a grown epitaxial material on a top surface of the fin disposed within the first fin-containing region.

* * * * *